United States Patent
Doerr et al.

[19]

[11] Patent Number: 6,055,250
[45] Date of Patent: Apr. 25, 2000

[54] MULTIFREQUENCY LASER HAVING REDUCED WAVE MIXING

[75] Inventors: Christopher Richard Doerr, Atlantic Highlands; Charles H. Joyner, Red Bank Township; Rene Henri Monnard, Old Bridge Township, Monmouth County; Lawrence Warren Stulz, Shark River Hills, all of N.J.

[73] Assignee: Lucent Technologies Inc., Murray Hill, N.J.

[21] Appl. No.: 09/042,314

[22] Filed: Mar. 13, 1998

Related U.S. Application Data

[60] Provisional application No. 60/064,637, Nov. 7, 1997.

[51] Int. Cl.$^7$ .................................................. H01S 3/082
[52] U.S. Cl. .............................................. 372/23; 372/97
[58] Field of Search .................................. 372/6, 7, 9, 20, 372/23, 24, 97

[56] References Cited

U.S. PATENT DOCUMENTS

| | | | |
|---|---|---|---|
| 3,970,963 | 7/1976 | Chester | 372/20 X |
| 5,115,444 | 5/1992 | Kirkby et al. | 372/97 X |
| 5,373,516 | 12/1994 | Glance et al. | 372/20 |
| 5,396,507 | 3/1995 | Kaminow et al. | 372/20 |
| 5,444,725 | 8/1995 | Zirngibl | 372/20 |
| 5,450,431 | 9/1995 | Glance et al. | 372/20 X |
| 5,524,014 | 6/1996 | Kaminow et al. | 372/23 X |
| 5,675,592 | 10/1997 | Dragone et al. | 372/20 |
| 5,881,079 | 3/1999 | Doerr et al. | 372/20 |

OTHER PUBLICATIONS

J. B. D. Soole, K. Poguntke, A. Scherer, H.P. LeBlanc, C. Chang–Hasnain, J. R. Hayes, C. Caneau, R. Bhat, and M. A. Koza, "Multiple–stripe array grating Integrated cavity (Magic) laser: A new semiconductor laser for WDM applications," *Electron. Lett.*, vol. 28, pp. 1805–1807, 1992 (Sep.).

M. Zirngibl, C. H. Joyner, L. W. Stulz, U. Koren, M.–D. Chien, M. G. Young, and B. I. Miller, "Digitally tunable laser based on the integration of a waveguide grating multiplexer and an optical amplifier," *IEEE Photon. Technol. Lett.*, vol. 6, pp. 516–518, 1994 (Apr.).

F. Forghieri, R. W. Tkach, A. R. Chraplyvy, and D. Marcuse, "Reduction of four wave mixing crosstalk in WDM systems using unequally spaces channels," *IEEE Photon. Technol. Left.*, vol. 6, pp. 754–756, 1994 (Jun.).

*Primary Examiner*—John D. Lee

[57] ABSTRACT

A multifrequency laser (MFL) eliminates nonlinearities produced in the "shared" waveguide of the MFL laser (the section in which all the lightwaves from all the lasers pass) by either making the shared waveguide as short as possible to mimimize the production of mixing product signals or using a channel spacing that is unequal such that any mixing product signals formed from the multifrequency optical laser signal do not overlap in frequency with any of the signals of the multifrequency optical laser signal.

9 Claims, 9 Drawing Sheets

MULTIFREQUENCY LASER HAVING REDUCED WAVE MIXING

This application claims the priority date of the corresponding provisional application, Ser. No. 60/064637, filed Nov. 7, 1997.

FIELD OF THE INVENTION

The invention relates generally to Wavelength-Division-Multiplexed (WDM) optical communications and, more particularly, to multifrequency lasers for use in such systems.

BACKGROUND OF THE INVENTION

When more than two channels of a Wavelength-Division-Multiplexed (WDM) laser operate simultaneously in continuous-wave Is mode, wave-mixing ($X^{(3)}$) in the passive shared waveguide can cause laser instabilities, resulting in spontaneous fluctuations in frequency and power. This problem is especially pronounced in WDM lasers that use a shared dispersive element, and in WDM systems where channel spacing is uniform.

Shared angular dispersive element lasers (SDELs) are a set of lasers that share the same intracavity angular dispersive element, such as a reflective or waveguide grating. Examples are the multiple-stripe array grating in a cavity (MAGIC) laser [1] and the waveguide grating router multifrequency laser (MFL) [2]. (Note, the number in brackets refers to a reference listed in the Appendix.) SDELs are well suited for WDM communications since they provide a large set of accurately spaced lasing wavelengths. MFLs have been demonstrated in systems experiments when operated continuous wave (cw) one channel at a time [3], and directly-modulated all channels at the same time [4]. It would also be useful to run all the lasers cw simultaneously, providing a source for long-haul WDM networks in which only one wavelength would have to be tuned to a reference, the rest of the lasers automatically aligned.

Wavelength-division-multiplexing (WDM) sources that consist of many lasers all sharing the same intracavity angular dispersive element (filter) are valuable because they can provide many wavelength channels simultaneously, the wavelengths inherently accurately spaced.

Undesireably however, in such a MFL source the laser signals may interact with each other via wave-mixing to produce unwelcomed crosstalk.

SUMMARY OF THE INVENTION

In accordance with the present invention, we have found that in a multifrequency laser (MFL) the optical laser signals can interact with each other via non-linearities in the "shared" waveguide; that is, the waveguide in the laser in which all the lightwaves from all the lasers pass. These nonlinear interactions can lead to laser instabilities.

Our invention eliminates these nonlinearities by making the shared waveguide as short as possible without introducing crosstalk. It is not obvious that wave-mixing is large enough to cause instabilities.

More particularly, we disclose a multifrequency laser (MFL) for generating a multifrequency optical laser signal, the MFL comprising a waveguide grating router having a first and a second side; the first side coupled to an array of waveguides each having an amplifier terminated in a reflecting facet; and the second side coupled to one shared waveguide terminated in a reflecting facet which serves as an optical port, the improvement comprising selecting the length of the shared waveguide such that any mixing product signals generated by the beating of the frequencies in the optical laser signal in the shared waveguide are no greater than the level of the spontaneous emission noise floor of the MFL.

According to another aspect, the shared waveguide may be implemented to include a beam expander.

DETAILED DESCRIPTION

Figure 1:
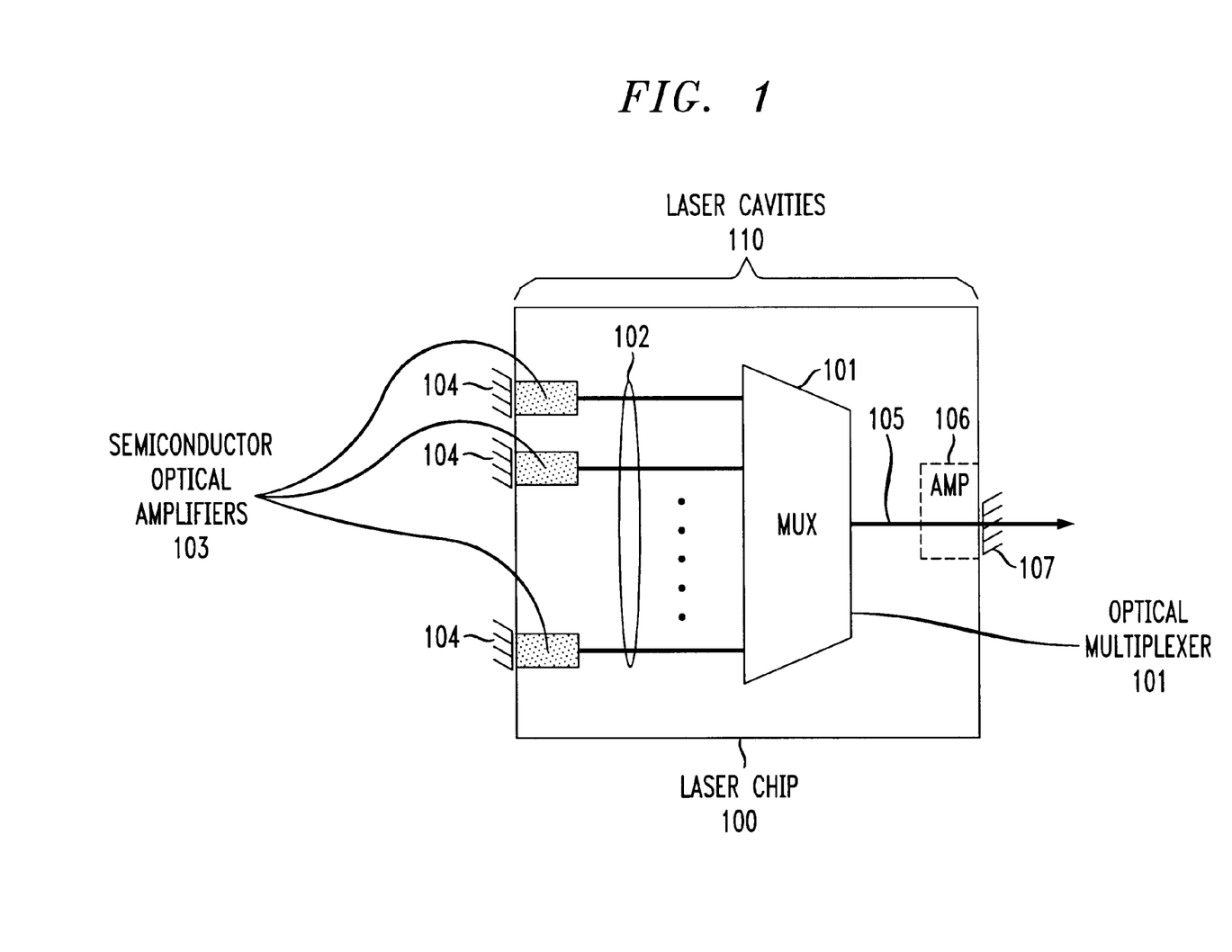
FIG. 1 shows a block diagram of a an illustrative semiconductor multifrequency laser (MFL)
Figure 2A:
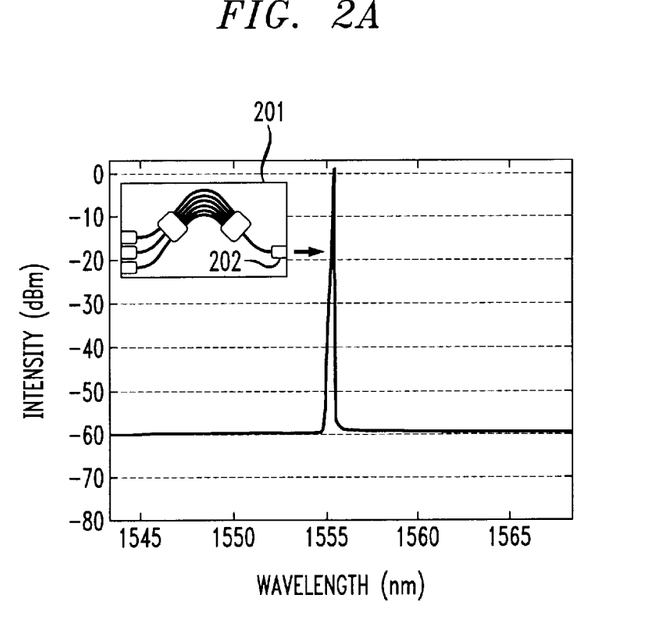
FIG. 2 illustrates the lasing spectra from a 200 GHz-spacing MFL with a shared amplifier with (a) only one channel on, (b) only two adjacent channels on, only two non-adjacent channels on, and (d) eight channels on. The inset shows the block diagram of the MFL.
Figure 2B:
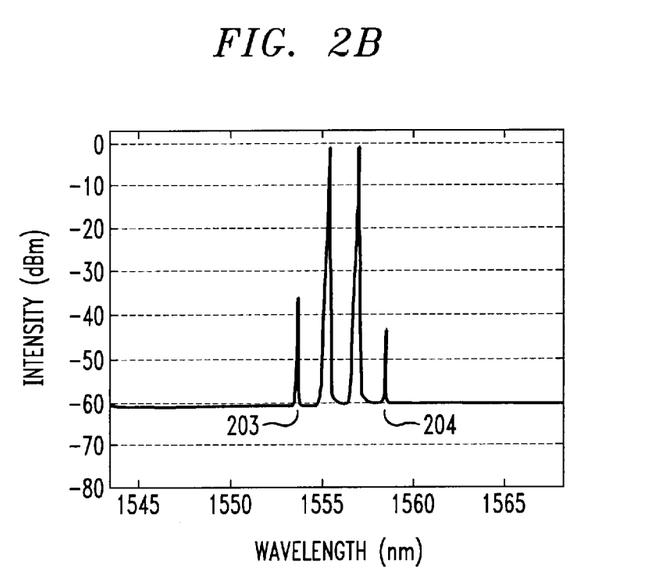
Figure 2C:
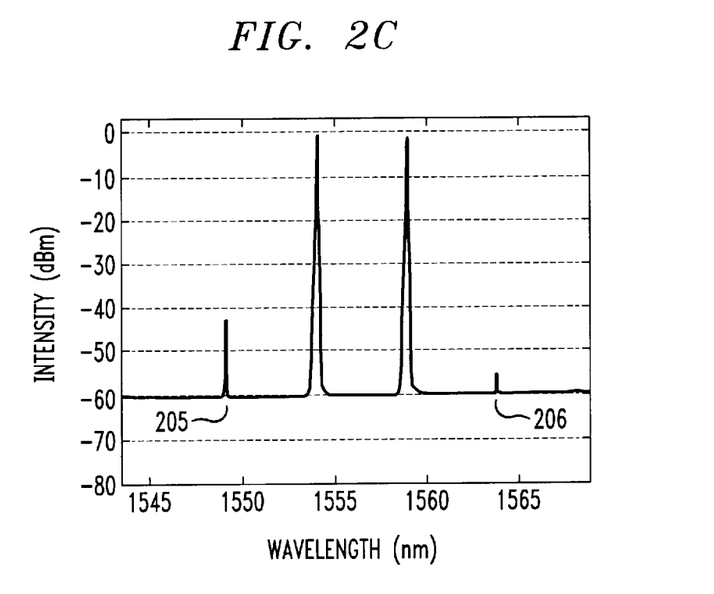
Figure 2D:
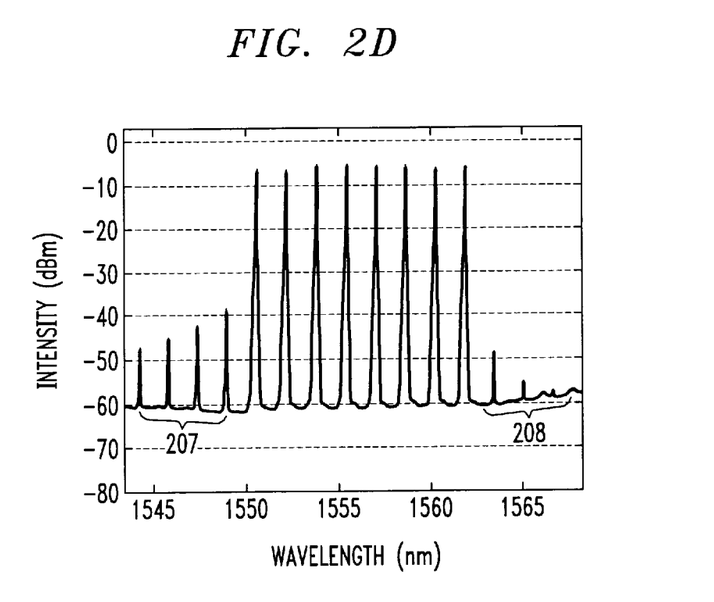
Figure 3A:
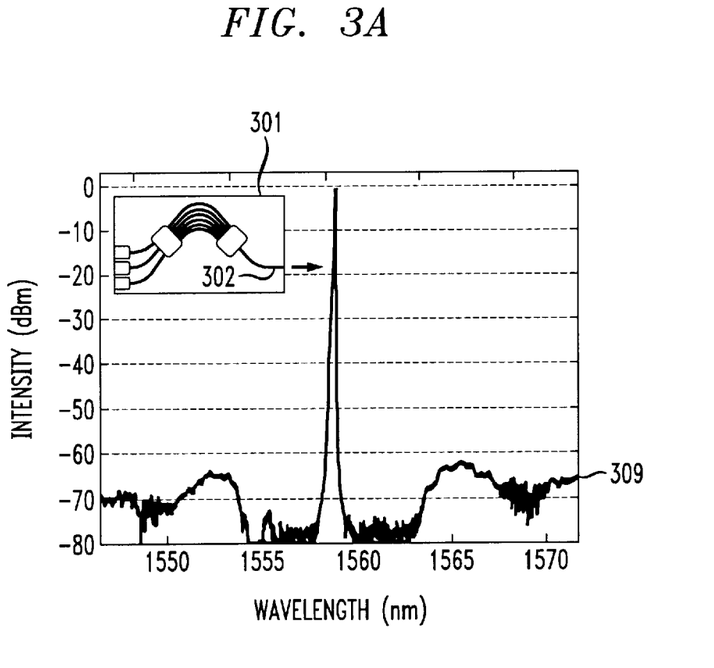
FIG. 3 shows illustrative lasing spectra from a 100 GHz-spacing MFL without a shared amplifier, under the same conditions as in FIG. 2.
Figure 3B:
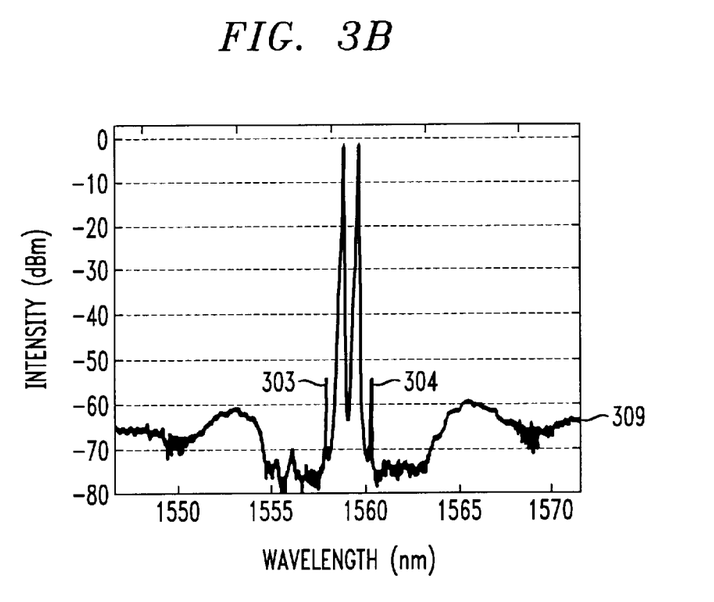
Figure 3C:
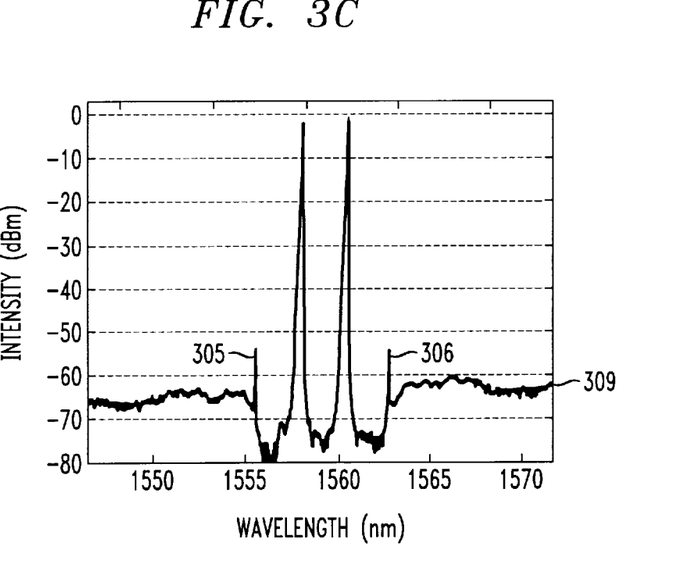
Figure 3D:
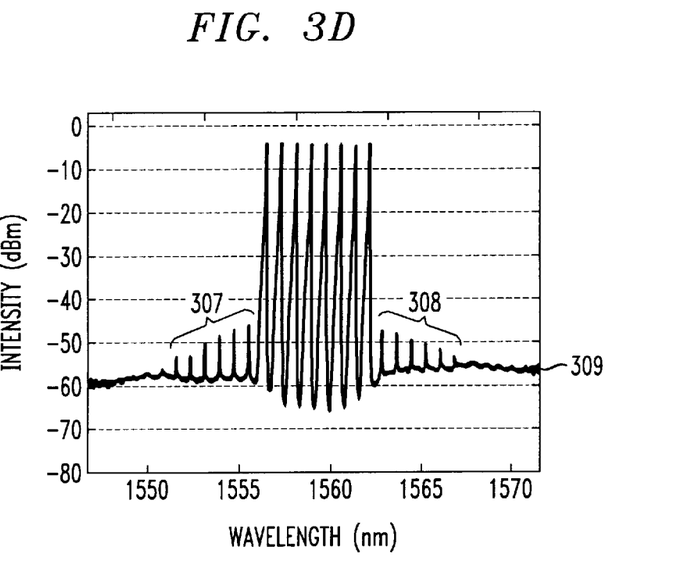

With reference to FIG. 1, there is shown a semiconductor multifrequency laser (MFL) 100 which comprises a waveguide grating router 101 having a first side and a second side, the first side coupled to an array of waveguides 102 with amplifiers 103 terminated in reflecting facets 104, and the second side coupled to one waveguide 105, the "shared" waveguide terminated in a reflecting facet 107. The waveguide may be implemented to include either an amplifier 106, as in FIG. 2, or without an amplifier, as in FIG. 3. All of the MFLs have grating chirp, angular chirp, and focal length adjustment so that each laser has only one passband in which to lase [5]. All of the channels are equally-spaced in frequency. Also, all of the cavities 110 are short enough, the passband widths narrow enough, and the intracavity reflections small enough, to guarantee single-longitudinal mode lasing [6]. The waveguiding structure is a rib-loaded slab of predominantly 1.3 μm bandgap material buried in InP, and the amplifiers are ~1.55 μm bandgap quantum wells on top of the rib.

FIG. 2 shows (a) the cw lasing of a solitary channel, (b) two adjacent channels simultaneously, (c) two non-adjacent channels simultaneously, and (d) 8 channels simultaneously in a 200 GHz spacing, 2000 GHz free-spectral-range (FSR), 100 grating arm, fully packaged MFL 201 with a shared amplifier 202. Lasing threshold is 24 mA total (array+shared), and the single-channel fiber-coupled output power is 0 dBm at 150 mA total at 19° C. From FIGS. 2b–d, one notices there is strong wave-mixing in the laser, e.g., see 203–208. The wave-mixing product powers decrease with increasing frequency separation, e.g., compare 205 vs 203, and the higher frequency product is significantly stronger than the lower frequency one, e.g., compare 203 vs 204. These facts signify that the dominant mixing product $X^{(3)}$ is complex and frequency dependent, i.e., that the dominant nonlinearity is near a resonance [7], the bandgap. Thus, the nonlinearity occurs in the shared amplifier 202 and is generally attributed to carrier density changes [8], spectral-hole burning [8,9], carrier heating [9], two-photon absorption [10], and the optical Stark effect [9].

Figure 4A:
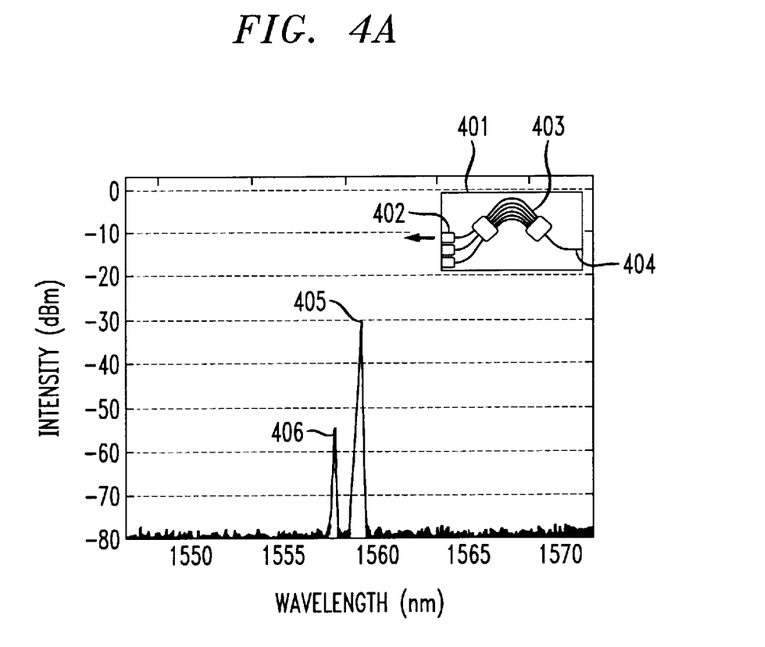
FIG. 4 shows illustrative lasing spectra from (a) the shared port and (b) one of the array amplifier of an MFL without a shared amplifier. The power is low in (a) because the array facet is high-reflection coated.
Figure 4B:
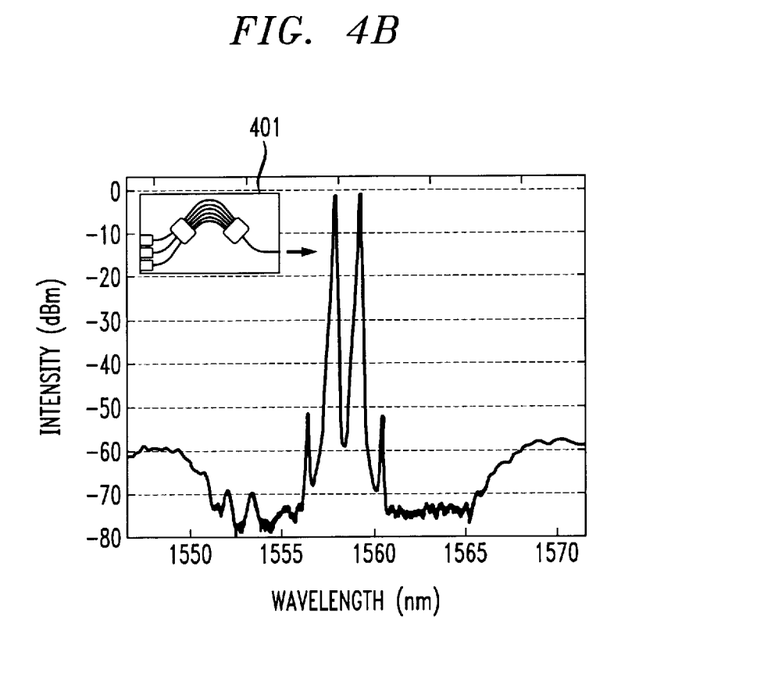

Removing the shared amplifier 202 eliminates all these nonlinearities except for two-photon absorption, the optical Stark effect, and other ultra-fast bound electronic nonlinearities. For example, removing the shared amplifier 202 significantly reduces interchannel crosstalk under simultaneous direct modulation[4]. FIG. 3 shows the same cases as in FIG. 2 except that this MFL 301 has 100 GHz spacing, 800 GHz FSR, 40 grating arms, and no shared amplifier. Lasing threshold is 32 mA, the single-channel fiber-coupled power is +2 dBm at 100 mA at 19° C. (this MFL has four quantum wells as opposed to three in the MFL of FIG. 2). Even though there is no shared amplifier, there are mixing products, e.g., see 303–308, visible above the >70 dB down spontaneous emission noise floor. This wave-mixing occurs in the shared passive waveguide, 302. To prove this, FIGS. 4a and b show the spectra of two simultaneous lasing channels taken from one of the array ports 402 and the shared port 404, respectively, of a different MFL 403 but with the same characteristics as above. From the array port 402, one can see the channel 405 that lases on that array port plus crosstalk 406 from the other lasing channel, 25 dB down. If the wave-mixing occurred in the array amplifier 403, the products would have to be only ~25 dB down from the lasing mode in order to end up at their 50 dB down level in the shared port 404, because the products are rejected by the grating, which has a crosstalk of ~25 dB. Since no products can be seen in FIG. 4a, and since we can neglect any wave-mixing in the grating 403 since there the power is divided among 40 waveguides, the wave-mixing must occur in the shared waveguide 404. Other evidences include the observation that unlike the wave-mixing in the amplifier of FIG. 2, a near-resonant system, the wave-mixing product powers are the same and do not change noticeably with frequency separation, both compatible with a $X^{(3)}$ from an off-resonant system [7], a passive waveguide.

One can represent the effect of $X^{(3)}$ as an optical power (P) dependent refractive index: $n = n_o + (n_2/A_{eff})P$, $A_{eff}$ being the effective mode cross-sectional area [7]. If the input field to such a material contains two frequencies, $\omega_1$ and $\omega_2$, then two new frequencies will be generated: $2\omega_p - \omega_q$, where p=1 and q=2 and vice versa. The powers in the new frequencies are:

$$P_{2w_p - w_q} = \left(\frac{2\pi |n_2| z}{A_{eff} \lambda_0}\right)^2 P_{w_p}^2 P_{w_q} \quad (1)$$

Eq. (1) ignores chromatic dispersion and so holds only for $z \ll 2/\Delta\beta_{2p-q}$, the phase-matching coherence length [7, 11], where $\Delta\beta_{2p-q} = \beta(2\omega_p - \omega_q) - [2\beta(\omega_p) - \beta(\omega_q)]$. $\beta(\omega)$ is the propagation constant in the waveguide at frequency $\omega$. For the MFL waveguides, the phase-mixing coherence length is $2/\Delta\beta_{2p-q} = 21$ km $(\text{GHz})^2/(\Delta f)^2$ at $\lambda_0 = 1.555$ μm, where $\Delta f$ is the frequency separation between the mixing waves. For example, for two wavelengths spaced by 100 GHz, the phase-mixing coherence length is 2.1 m. Beyond the coherence length, the wave-mixing products decay and rise in a periodic fashion.

With reference to FIG. 1, the dominant wave-mixing is from waves moving toward the output facet, 107, in the shared waveguide 105. The backward propagating waves can be neglected because of the −5 dB output facet 107 reflectivity. When only two channels are lasing, the wave mixing products do not survive one round-trip through the laser cavity 110 since they are either sent to an inactive amplifier, one of the group 103, or no waveguide at all by the grating 101. Thus, from measurements, the magnitude of $n_2$ of the MFL waveguides may be calculated. The parameter values are $A_{eff} \approx 2.0 \times 0.5$ μm$^2$, $P_{\omega_p} = P_{\omega_q} = 2$ mW, $P_{2\omega_p - \omega_q}/P_{\omega_q} = -53$ dB, and the shared waveguide length z=3.0 mm. So from Eq. (1), we obtain a value for the magnitude of the nonlinear-index coefficient $|n_2|$ of our InGaAsP waveguides of $\approx 0.9 \times 10^{-12}$ cm$^2$/W. It is expected that this value will be close to the ultra short time constant component of $n_2$ of bulk InGaAsP amplifiers, which has been well documented by pump-probe experiments. Hall, et al. report a $n_2$ of $\sim -1.5 \times 10^{-12}$ cm$^2$ for the case of transparency [9], in good agreement. For passive AlGaAs waveguides, LaGasse et. al. measured a $n_2$ of $\sim -1 \times 10^{-12}$ cm$^2$/W[12], also in good agreement. For interest, the $n_2$ of silica optical fiber is $\sim 2.7 \times 10^{-16}$ cm$^2$/W.

Figure 5A:
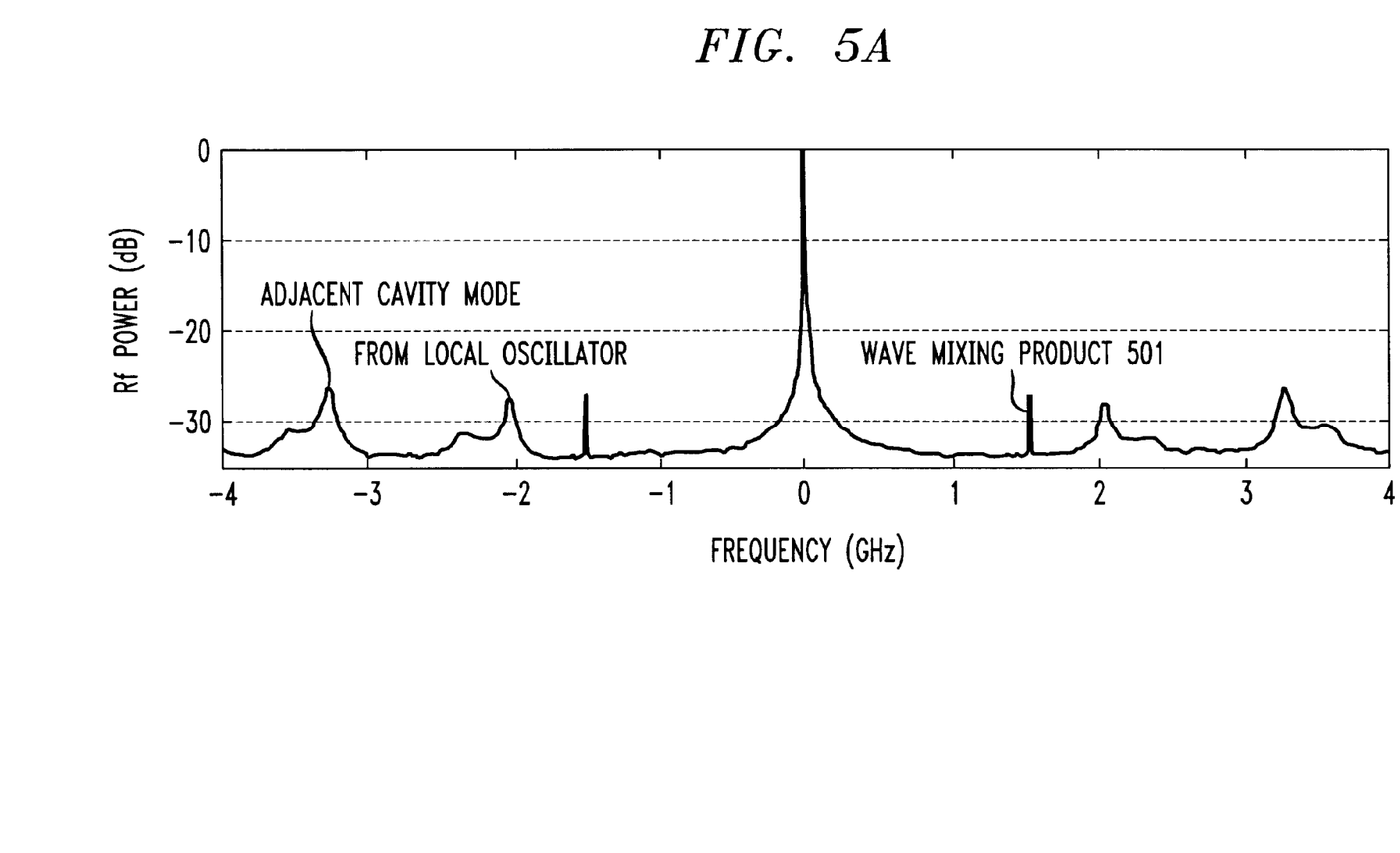
FIG. 5 shows heterodyne spectra taken by beating an external cavity laser (the local oscillator) with the MFL of FIG. 2 with three adjacent channels on (a) the wave-mixing products from the other two channels fall outside all cavity modes of the monitored channel,(b) the mixing products fall into a non-lasing cavity mode, and (c) the mixing product is about 100 MHz away from falling into a lasing cavity mode.

When more than two channels are lasing, then although some wave-mixing products are sent to an array port with an active amplifier, the products' frequencies generally do not match any of the cavity mode frequencies for the channels into which they fall, and they, too, do not survive one round-trip. FIG. 5A shows a heterodyne spectrum of a lasing channel (taken by beating the MFL output with that of an external-cavity laser) when three adjacent channels are lasing simultaneously. One can see one of the wave-mixing products 501 generated by the other two channels. Actually, one can see two wave-mixing products placed symmetrically about the lasing mode. The other product most likely is generated in the array amplifier from the beating of the first wave-mixing product and the lasing mode. Note that a heterodyne spectrum displays electric field, so the optical power levels are twice the decibel levels shown in the figure. As one can see, the wave-mixing product remains harmlessly at a level of ~53 dB down from the lasing mode.

Figure 5B:
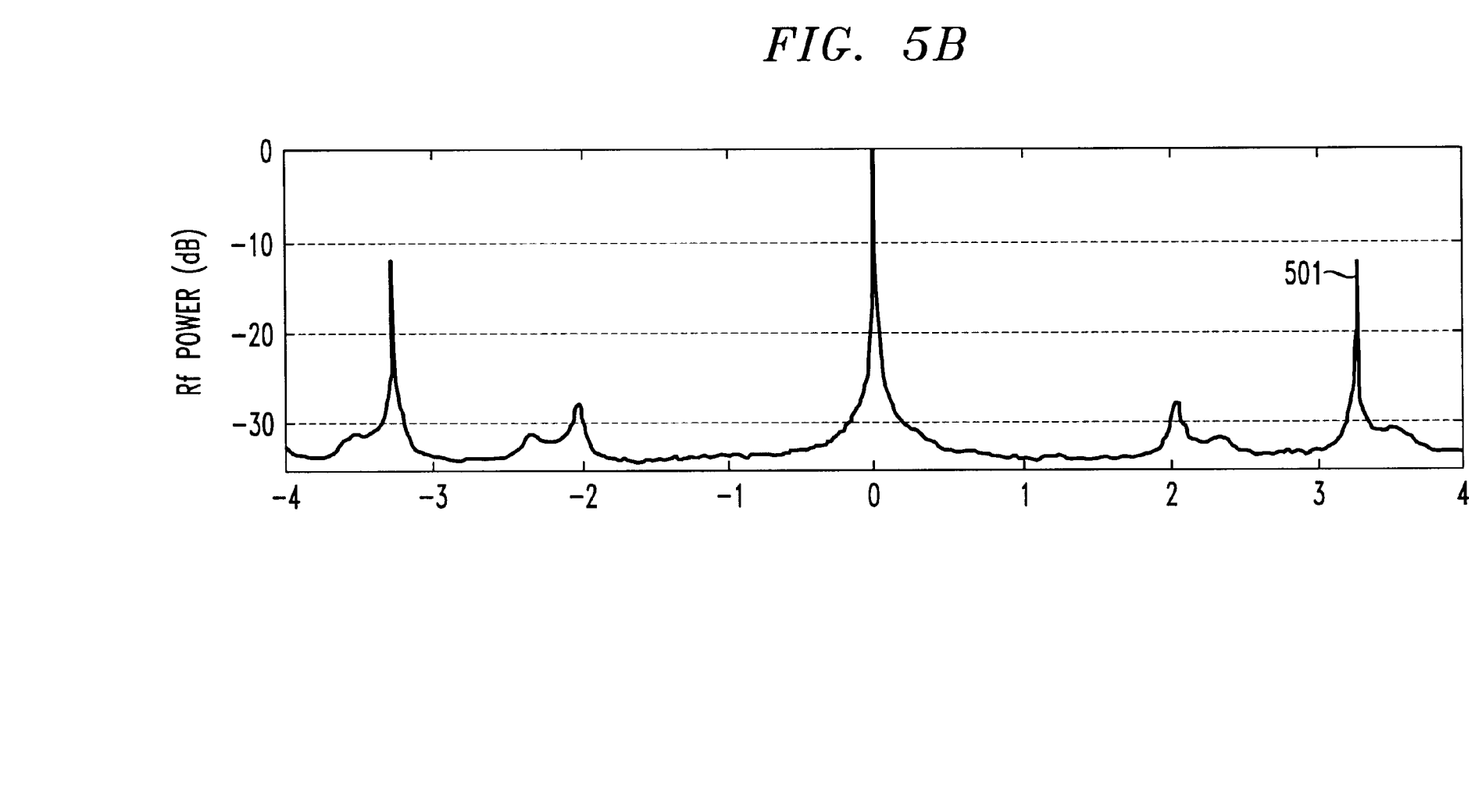
Figure 5C:
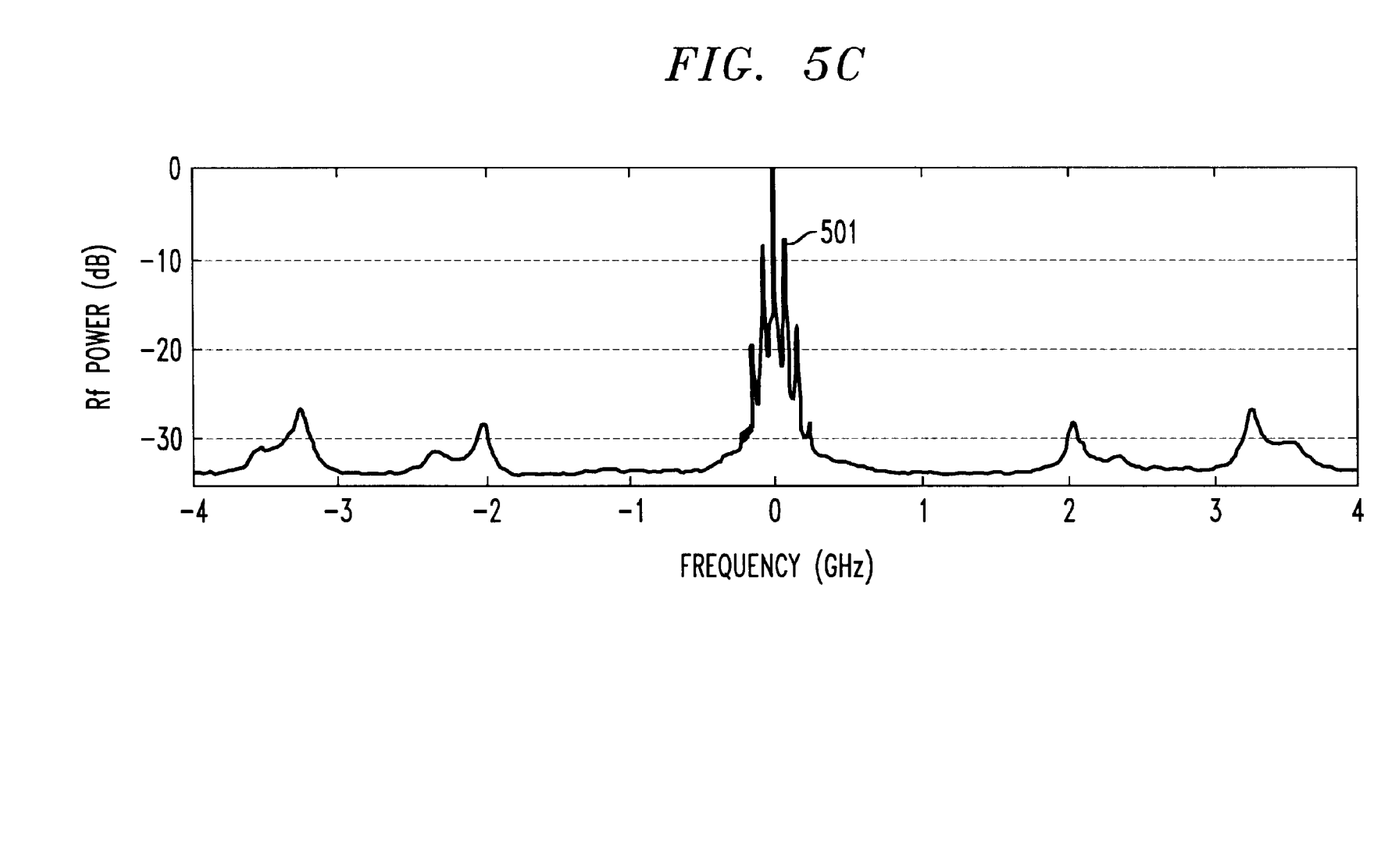

However, dramatic things happen when a wave-mixing product falls into a cavity mode of a lasing channel, of which there are several under each angular dispersive element passband. This can be made to happen experimentally by changing the bias currents to the amplifiers. The first possibility, shown in FIG. 5b, is that the wave-mixing product falls into a non-lasing cavity mode. In such a case the side-modes of the affected lasing channel, which are normally ~52 dB down in power, rise to be only ~23 dB down and stably remain there. The second possibility is that the wave-mixing product falls into a lasing cavity mode. Actually, the wave-mixing products from three channels must fall into the three channels simultaneously. This is termed the "alignment condition", and it occurs when three channels are evenly-spaced in frequency. Because of the relatively long phase-matching coherence length, the wave-mixing products, now able to survive a round-trip, build up to levels high enough to compete with the lasing mode. FIG. 5c shows the heterodyne spectrum when the wave-mixing products are ~100 MHz from the alignment condition. In the time domain, one can typically observe ~0.1% sinusoidal power fluctuation at a frequency given by the imperfection in channel spacing.

Once the mixing products are within ~+−30 MHz of the alignment condition, all of the channels spontaneously fluctuate in amplitude and frequency, typically ~5% in power and ~500 MHz in frequency. Because of the chromatic dispersion in the waveguides, the phases between the mixing products and the lasing modes must drift, and subsequently the laser frequencies are forced to shift in an unstable manner. All of the lasing channels fluctuate rather than just the three channels in the alignment condition, which is because of the fluctuation-induced index changes in the shared waveguide.

One possible way to prevent any chance of fluctuations is to make the MFL have an unequal channel spacing, similar to the idea proposed to avoid four-wave-mixing in long-haul networks [13]. Another, more versatile, way is to reduce the wave-mixing so much so as to bury it in the amplifier spontaneous emission. Then the wave-mixing products will be unable to accumulate over many round trips. From FIG. 3, one sees that the mixing products' power would have to be reduced by at least ~20 dB. Since the mixing product power varies quadratically with z, one could simply reduce the length of the shared waveguide by a factor of 10, from 3 mm to 300 μm. In one embodiment, the length is less than 100 μm from the output of MUX to the end of the laser cavity. A further reduction in the wave-mixing could be accomplished by implementing a beam expander in the shared waveguide, increasing $A_{eff}$.

What has been described is merely illustrative of the application of the principles of the present invention. Other arrangements and methods can be implemented by those skilled in the art without departing from the spirit and scope of the present invention.

APPENDIX

References

[1] J. B. D. Soole, K. Poguntke, A. Schere, H. P. LeBlanc, C. Chang-Hasnain, J. R. Hayes, C. Caneau, R. Bhat, and M. A. Koza, "Multiple-stripe array grating in a cavity (MAGIC) laser: A new semiconductor laser for WDM applications," *Electron. Lett.*, vol.28, pp. 1805–1807,1992.

[2] M. Zirngibl, C. H. Joyner, L. W. Stulz, U. Koren, M.-D. Chien, M. G. Young, and B. I. Miller, "Digitally tunable laser based on the integration of a waveguide grating multiplexer and an optical amplifier," *IEEE Photon. Technol. Lett.*, vol.6, pp.516–518,1994.

[3] R. Monnard, M. Zirngibl, C. R. Doerr, C. H. Joyner, and L. W. Stulz, "Demonstration of a 8-Wavelength Fast Packet Switching Transmitter of 2.5 Gb/s Bit Stream," submitted to *IEEE Photon. Technol. Lett*

[4] R. Monnard, C. R. Doerr, C. H. Joyner, M. Zimgibl, and L. W. Stulz, "Direct Modulation of a Multifrequency Laser up to 16×622 Mb/s," *IEEE Photon. Technol. Lett.*, vol.9, pp. 815–817,1997.

[5] C. R. Doerr, C. H. Joyner, L. W. Stulz, and J. C. Centanni, "Wavelength Selectable Laser With Inherent Wavelength and Single-Mode Stability," *IEEE Photon. Technol. Leff*, vol.9, pp.1430–1432, November, 1997.

[6] C. R. Doerr, "Theoretical Stability Analysis of Single-Mode Operation in Uncontrolled Mode-Selection Lasers," *IEEE Photon. Technol Left.*, vol.9, pp. 1457–1459, November, 1997.

[7] R. W. Boyd, *Nonlinear Optics*, Academic Press, San Diego, 1992.

[8] G. P. Agrawal, "Population pulsations and nondegenerate four-wave mixing in semiconductor lasers and amplifiers," *J. Opt. Soc. Am. B,* vol.5, pp.147–158, 1988.

[9] K. L. Hall, G: Lenz, A. M. Darwish, and E. P. Ippen, "Subpicosecond gain and index nonlinearities in InGaAsP diode lasers," *Optics Communications*, vol.111, pp.589–612, 1994.

[10] M. Sheik-Bahae, D. J. Hagan, and E. W. Van Stryland, "Dispersion and Band-Gap Scaling of the Electronic Kerr Effect in Solids Associated with Two-Photon Absorption," *Phys. Rev. Lett*, vol.65, pp.96–99, 1990.

[11] K. O. Hill, D. C. Johnson, B. S. Kawasaki, and R. 1. MacDonald, "CW three-wave mixing in single-mode optical fibers," *J Appl. Phys.*, vol.49, p.5098, 1978.

[12] M. J. LaGasse, K. K. Anderson, C. A. Wang, H. A. Haus, and J. G. Fujimoto, "Femotosecond measurements of the nonresonant nonlinear index in AlG~s," *Appi. Phys. Lett*, vol.58, pp. 417–419, 1990.

[13] F. Forghieri, R. W. Tkach, A. R. Chraplyvy, and D. Marcuse, "Reduction of four wave mixing crosstalk in WDM systems using unequally space channels," *IEEE Photon. Technol. Left.*, vol.6, pp.754–756, 1994.

We claim:

1. A multifrequency laser (MFL) for generating a multifrequency optical laser signal, the MFL comprising an angular dispersive element having a first and a second side; the first side coupled to an array of waveguides each having an amplifier and a reflecting facet; and the second side coupled to a shared waveguide terminated in a reflecting facet which, the improvement comprising selecting the length of the shared waveguide such that any mixing product signals formed from the multifrequency optical laser signal are no greater than the level of the spontaneous emission noise floor of the MFL.

2. The multifrequency laser of claim 1 wherein said angular dispersive element is a waveguide grating router.

3. The multifrequency laser of claim 1 wherein said shared waveguide includes a beam expander.

4. The multifrequency laser of claim 1 wherein the length of said shared waveguide is less than 100 μm in length.

5. The multifrequency laser of claim 1 wherein the length of said shared waveguide is substantially less than 3 mm in length.

6. A multifrequency laser (MFL) for generating a multifrequency optical laser signal, the MFL comprising an angular dispersive element having a first and second side, the first side coupled to an array of waveguides each having an amplifier and a reflecting facet; and the second side terminated with a reflecting facet without any waveguide thereby minimizing any mixing product signals formed from the multifrequency optical laser signal, wherein one of the reflecting facets of the first side and the reflecting facet of the second side form a laser cavity for each laser signal of the multifrequency laser.

7. The multifrequency laser of claim 6 wherein the angular dispersive element is a waveguide grating router.

8. The multifrequency laser of claim 6 wherein said shared waveguide includes a beam expander.

9. A method of reducing multifrequency optical laser signal fluctuations in a multifrequency laser (MFL) comprising the steps of generating a multifrequency optical laser signal in an MFL which includes a shared waveguide as part of the laser cavity for the multifrequency optical laser signal and selecting the length of said shared wavelength of the MFL so that any mixing product signals formed from the multifrequency optical laser signal are no greater than the level of the spontaneous emission noise floor of the MFL.

* * * * *